(12) United States Patent
Haas et al.

(10) Patent No.: US 11,865,931 B2
(45) Date of Patent: Jan. 9, 2024

(54) LINE SET FOR A CHARGING STATION, CHARGING STATION

(71) Applicant: Robert Bosch GmbH, Stuttgart (DE)

(72) Inventors: Martin Haas, Vienna (AT); Stephan Woeber, Möllersdorf (AT)

(73) Assignee: Robert Bosch GmbH, Stuttgart (DE)

( * ) Notice: Subject to any disclaimer, the term of this patent is extended or adjusted under 35 U.S.C. 154(b) by 409 days.

(21) Appl. No.: 17/285,560

(22) PCT Filed: Oct. 16, 2019

(86) PCT No.: PCT/EP2019/078070
§ 371 (c)(1),
(2) Date: Apr. 15, 2021

(87) PCT Pub. No.: WO2020/079072
PCT Pub. Date: Apr. 23, 2020

(65) Prior Publication Data
US 2021/0394629 A1  Dec. 23, 2021

(30) Foreign Application Priority Data

Oct. 17, 2018  (DE) .................... 10 2018 217 743.0

(51) Int. Cl.
*B60L 53/18*   (2019.01)
*B60L 53/60*   (2019.01)
(Continued)

(52) U.S. Cl.
CPC ............... *B60L 53/18* (2019.02); *B60L 53/16* (2019.02); *B60L 53/60* (2019.02); *H02J 7/0045* (2013.01); *H02J 7/0047* (2013.01)

(58) Field of Classification Search
CPC .......... B60L 53/18; B60L 53/60; B60L 53/16; H02J 7/0045; H02J 7/0047
USPC ....................................................... 320/109
See application file for complete search history.

(56) References Cited

U.S. PATENT DOCUMENTS

| | | | |
|---|---|---|---|
| 3,981,181 A * | 9/1976 | Ochiai ................. | G01M 3/165 174/11 R |
| 4,897,044 A * | 1/1990 | Rood .................... | H01R 11/24 320/105 |

(Continued)

FOREIGN PATENT DOCUMENTS

| EP | 1178290 A2 | 2/2002 |
|---|---|---|
| GB | 2276766 A | 10/1994 |

(Continued)

OTHER PUBLICATIONS

SAE International, "Surface Vehicle Standard, SAE Electric Vehicle and Plug in Hybrid Electric Vehicle Conductive Charge Coupler", Oct. 2017, 116 Pages (Year: 2016).*

(Continued)

*Primary Examiner* — Nathaniel R Pelton
(74) *Attorney, Agent, or Firm* — Michael Best & Friedrich LLP

(57) ABSTRACT

The invention relates to a line set (4) for a charging station (1) for charging electrical energy stores of motor vehicles (2), comprising a charging cable (5) which, at a free end, has a connecting plug (6) for electrical connection to the motor vehicle (2), wherein the charging cable (5) has one or more electric lines (19) which are jointly covered by an electrically insulating sheath (9). The sheath (9) has at least one electric test line (11, 12) extending along the charging cable (5) and electrically insulated from the lines (19).

20 Claims, 3 Drawing Sheets

(51) Int. Cl.
    *B60L 53/16*     (2019.01)
    *H02J 7/00*     (2006.01)

(56) References Cited

U.S. PATENT DOCUMENTS

| | | | |
|---|---|---|---|
| 6,078,014 A | 6/2000 | Kashiwazaki et al. | |
| 2002/0079905 A1* | 6/2002 | Brown | H01B 7/328 324/543 |
| 2005/0268734 A1* | 12/2005 | Watkins Jr. | G01N 27/041 73/866 |
| 2009/0183579 A1* | 7/2009 | Abe | G01L 1/20 73/862.627 |
| 2016/0109394 A1* | 4/2016 | Auzanneau | H01B 1/02 324/649 |

FOREIGN PATENT DOCUMENTS

| | | |
|---|---|---|
| JP | H10106868 A | 4/1998 |
| WO | 03076953 A2 | 9/2003 |
| WO | 2013030637 A2 | 3/2013 |

OTHER PUBLICATIONS

Translation of International Search Report for Application No. PCT/EP2019/078070 dated Jan. 2, 2020 (2 pages).
SAE International, "Surface Vehicle Standard, SAE Electric Vehicle and Plug in Hybrid Electric Vehicle Conductive Charge Coupler", Oct. 2017, 116 pages.

\* cited by examiner

LINE SET FOR A CHARGING STATION, CHARGING STATION

BACKGROUND

The invention relates to a line set for a charging station for charging an electrical energy store of motor vehicles, having a charging cable which, at a free end, has a connecting plug for electrical connection to a motor vehicle, wherein the charging cable has one or more electrical lines which are together encompassed by an electrically insulating sheath.

The invention furthermore relates to a charging station for charging electrical energy stores of motor vehicles, which has at least one line set as described above.

Line sets and charging stations of the type mentioned at the outset are known from the prior art. The number of available charging stations for motor vehicles which can be operated electrically is rising constantly. With the increasing number of electrically operable motor vehicles, in particular electric vehicles or hybrid vehicles, the number of times that such charging stations are used is also increasing, which means that the line sets are subject to greater wear. The electrical lines, which are possibly made from copper, are moreover at risk of vandalism or theft. Line sets can also become damaged as a result of being mishandled, for example if a motor vehicle rolls over a line set.

SUMMARY

The inventive line set is advantageous in that wear, damage or theft of a line set can be established and reported quickly and reliably. It is therefore possible to dispense with regular visual inspection of the line set. To this end, it is provided according to the invention that the sheath of the charging cable of the line set has at least one electrical test line, which extends along the charging cable, in particular parallel to the lines, and is electrically insulated with respect to the lines. If an electrical voltage is applied to the test line, for example, it is easily possible that the test line is damaged if a break in current is identified. By associating the test line with the sheath, the test line is damaged before the lines of the charging cable are themselves damaged, which means that early identification of wear or damage to the charging cable is ensured. As a result of the electrical insulation with respect to the lines, it ensured that physical electrical contact between the electrical lines and the test line, which could lead to false reports, cannot take place. The test line preferably extends over the entire length of the charging cable.

The sheath preferably has a pair or multiple pairs of test lines, wherein the test lines are each designed as described above and the test lines of a pair are coupled to one another by a respective electrical test resistor. A sudden voltage drop or an electrical short circuit can thus be easily and quickly identified. In this case, one of the test lines is preferably designed as a feed line and one of the test lines is designed as a return line, which each extend over the length of the charging cable and are coupled to one another by the test resistor at their end remote from the charging station, i.e. at the end facing the charging plug. The lines in the charging station can thus be electrically contacted in particular by a control device in order to monitor the state of the pair of test lines. In particular, a cable fault caused by an interruption in the test line, for example due to a slit, break or tear, can thus be detected. Likewise, a complete severing of the charging cable, for example in the event of theft, can thus be detected, wherein a plurality of such pairs of lines are then preferably arranged over the circumference of the sheath.

According to a preferred embodiment of the invention, the test lines of at least one pair are arranged adjacent to one another as seen in the circumferential direction. If the sheath becomes frayed or abraded due to wear and/or misuse until both test lines are exposed in some areas, a short circuit, in particular a short-circuit to ground, can occur, which can be easily established as a result of the advantageous design of the charging cable. Likewise, a short circuit can occur in the event of pinching or bending if the mutually adjacent test lines come into physical contact with one another. In particular, at least two pairs are arranged diametrically opposite one another in the circumferential direction in order to ensure theft identification. If the test lines of both pairs are severed, it can be easily established that the cable as a whole has been severed and a theft of the charging cable is highly likely to have occurred.

According to a further embodiment of the invention, the test lines of at least one pair or two different pairs are arranged radially above one another. For example, in the sheath, the feed line therefore lies on the inside and the return line on the outside. The test lines of different pairs preferably lie radially above one another so that a defect as a cable fault can be detected progressively.

According to a preferred further development of the invention, the respective test resistor is arranged in the connecting plug. The test resistor is thus reliably protected and held, in particular by a housing of the connecting plug. Connecting the test lines in the connecting plug is thus easily possible, which reduces the assembly and production effort for the line set.

It is furthermore preferably provided that the multiple pairs of test lines are preferably arranged uniformly distributed over the circumference of the sheath. As a result of the uniformly distributed arrangement, it is ensured that wear or damage to the charging cable can be detected as seen over the entire circumference of the charging cable. Moreover, the theft identification already described above is thus ensured.

The respective test line is preferably designed as a ribbon line. The respective test line therefore has a rectangular cross-section, with a small height and a large width compared to the height. As a result of their width, the test lines therefore have an advantageous extent in the sheath, whereby the circumference of the charging cable can be monitored as a whole, or virtually as a whole, with few test lines. Moreover, the ribbon lines can be easily configured to be flexible so that the test lines do not become damaged upon the use of the charging cable and a deformation of the charging cable and instead simply deform with the cable. To this end, the width of the ribbon line expediently extends in the circumferential direction of the sheath.

The respective ribbon line is particularly preferably aligned tangentially in the charging cable so that the width of the ribbon is aligned tangentially to the sheath or to the charging cable. This results in the advantages already mentioned above.

The sheath is particularly preferably cast or molded around the respective test line so that the test line is firmly integrated in the sheath. For example, the charging cable can thus be cost-effectively realized via an extraction method.

According to a further embodiment of the invention, the sheath preferably has two mutually coaxially arranged test lines, between which an electrical insulator acts. The test lines therefore lie at a radial spacing from one another and extend preferably over the entire circumference or virtually the entire circumference of the sheath. As a result of the insulator lying between them, it is achieved that the test lines do not come into physical contact with one another. However, in the event of damage to the cable, an interruption in the test lines and a short circuit between the test lines which results from the damage can be reliably identified.

The insulator is preferably designed as a radial spacer between the test lines and is preferably deformable such that the test lines can come into physical contact with one another as a result of a pinching or bending of the charging cable. The spacer is therefore a flexible or deformable spacer which, in the event of a high load on the charging cable, enables physical contact between the test lines, in particular the test lines arranged coaxially to one another, whereby an overload of the charging cable caused by pinching or bending can be reliably established. The spacer is preferably designed such that physical contact between the adjacent test lines is enabled before the deformation of the charging cable is so great that the lines routed through the charging cable become overloaded or damaged. Monitoring of the operation of the charging cable is thus ensured, which, in particular, outputs a warning signal before the lines themselves become overloaded or damaged.

The insulator is preferably designed as a pressure-dependent resistance foil or as a perforated structure. The spacer is thus easily safeguarded such that it only enables physical electrical contact or an electrical connection between two adjacent, in particular radially adjacent, test lines with an increasing deformation of the charging cable.

According to a preferred further development of the invention, at least one of the test lines is produced from a temperature-dependent resistance material. Beyond detecting the cable fault, it is thus also possible to detect critical heating of the cable. It can thus be identified, for example, if a charging procedure is not carried out correctly owing to a defect in the motor vehicle or the charging station. Moreover, depending on a detected temperature of the charging cable, the charging procedure can also be influenced to prevent overheating of the charging cable, for example. Therefore, if, for example, a predeterminable limit temperature is exceeded, the charging current is reduced to prevent further heating.

The, in particular, stationary charging station according to the invention is notable for at least one line set according to the invention and for a control device which is electrically connected to at least one of the test lines to identify a cable fault, as described above.

In this case, the use of the line set according to the invention is not restricted to stationary charging stations in particular. Therefore, for example according to a further embodiment of the invention, the line set is used as an additional or single charging cable of an electrically drivable motor vehicle so that the line set is transported with the vehicle. The line set can also be used in other high-voltage applications in which the requirements of the charging cable are similar to those in charging stations for electric vehicles or hybrid vehicles.

The charging station moreover preferably has means for displaying a detected cable fault. The means are designed in particular to generate an acoustic and/or visual signal which makes the user of the charging station aware of a cable fault or possibly the type of cable fault. In particular, the means are designed to promptly inform an owner or proprietor of the charging station of a cable theft. To this end, the charging station moreover also has a communication device by means of which the or an identified cable fault is automatically transmitted to a central data bank, for example of the owner of the charging station, when a cable fault is detected.

BRIEF DESCRIPTION OF THE DRAWINGS

Further advantages and preferred features and feature combinations are revealed in particular in the description and in the claims. The invention shall be explained in more detail below with reference to the drawings, which show:

DETAILED DESCRIPTION

Figure 1:
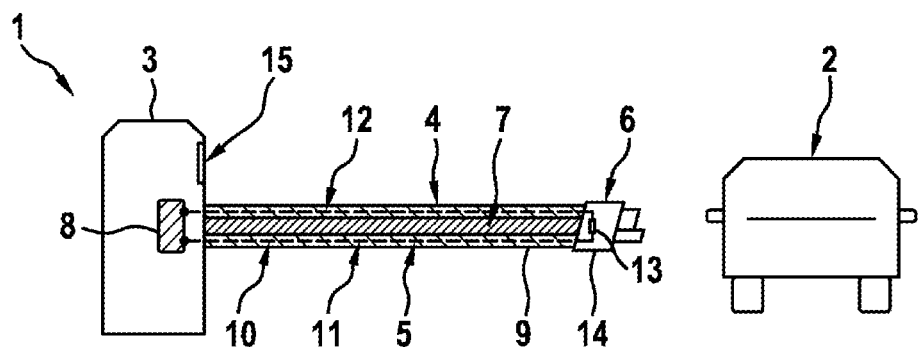
FIG. 1 a charging station for a motor vehicle in a simplified illustration.

FIG. 1 shows, in a simplified illustration, a charging station 1 for electrically charging an energy store of an electrically operable motor vehicle 2 in a simplified illustration.

The charging station 1 has a stationary charging column 3 to which a line set 4 is connected. The line set 4 has a deformable charging cable 5, which is connected to a column 3 at one end and to a connection plug 6 at the other end for electrical contact with the motor vehicle 2.

The charging cable 5 has a cable set 7 consisting of a plurality of electrical lines, which, on the one hand, are electrically connected to plug contacts of the connecting plug 6, and, on the other, electronics which are present in the charging column 3 and are designed to control or regulate a charging procedure. To this end, the charging column 3 has, in particular, a control device 8.

The cable set 7 is encompassed by an electrically insulating sheath 9, which bundles and protects and holds the cable set 7 together. A pair 10 of the test lines 11 and 12 run through the sheath 9. According to the following exemplary embodiment, the test lines 11, 12 run on mutually opposing sides of the cable 5 along the longitudinal extent thereof, parallel to the lines of the cable set 7. The test lines 11, 12 are electrically coupled to one another by an electrical test resistor 13, wherein the test resistor 13 is held in a housing 14 of the connecting plug 6. At the other end, the test lines 11, 12 are electrically connected to the control device 8.

In operation, the control device 8 applies an electrical voltage to the test lines 11, 12 so that a current flows. If the cable 5 is damaged and one of the test lines 11, 12 is severed, this is then detected by the control device 8 due to the absence of a current flow and a cable fault is identified.

In particular, the charging column 3 has means 15 for displaying the cable fault. The means 15 can be, for example, a screen or a speaker for outputting a visual and/or acoustic warning signal. The means 15 can likewise be a communication device which forwards the report of a cable fault to an operator of the charging station 1.

Figure 2:
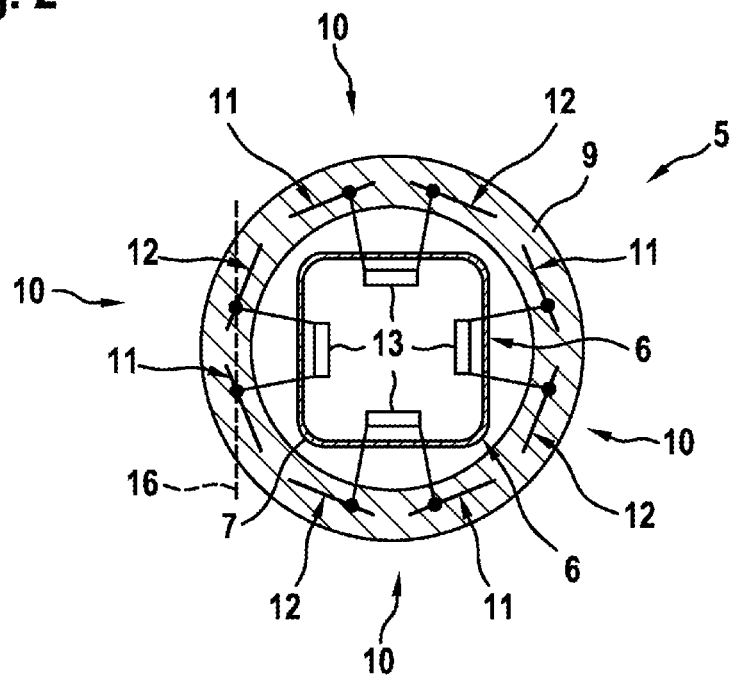
FIG. 2 a cross-section through a charging cable of the charging station according to a first application, FIG. 3 the cross-section of the charging cable according to a second application, FIG. 4 a further exemplary embodiment of the charging cable in a cross-sectional illustration, and FIG. 5 a longitudinal sectional illustration of the charging cable according to the further exemplary embodiment.

FIG. 2 shows a further exemplary embodiment of the charging cable 5 in a simplified cross-sectional illustration. The cable set 7 is not shown here for reasons of clarity. In contrast to the previous exemplary embodiment, multiple pairs 10 of test lines 11, 12 are now present, wherein the test lines 11, 12 of each pair 10 are coupled to one another by a separate test resistor 13. The test lines 11, 12 are each designed as ribbon lines which are arranged uniformly distributed over the circumference of the charging cable 5, at least substantially tangentially, in the sheath 9. In this case, the feed line and the return line of a pair 10 lie next to one another in the sheath 9, as seen in the circumferential direction. In the present case, the charging cable 5 or the sheath 9 has an annular cross-section. The test lines 11, 12 of a pair 10 are therefore each arranged adjacent to one another—as seen in the circumferential direction. The position of any damage as seen over the circumference of the charging cable 5 can thus be detected by means of the test lines 11, 12. The accuracy in identifying a cable fault can be varied via the number and cross-section of the test lines 11, 12.

If it is identified, for example, that the test line 11 of one of the pairs 10 has been interrupted, a cut, break or tear in the region of the charging cable 5 is therefore identified. If it is detected that all test lines 11, 12 or pairs 10 of test lines 11, 12 have been interrupted, it is identified that the cable 5 has been completely severed and possibly stolen.

If the sheath 9 is abraded due to friction and wear 9, as shown by way of example by a dashed line 16 in FIG. 2, it may be that the test lines 11, 12 lying in this region are exposed and are no longer protected by the insulating material of the sheath 9. If, in such a state, a short circuit or short circuit to ground occurs via the test lines 11, 12, because they are lying in a puddle or the like for example, the short circuit is likewise identified by the control device 8 and a frayed cable or damage to the insulation is reported as a cable fault. The material of the sheath 9 is preferably molded around the test lines 11, 12 to achieve advantageous integration.

Figure 3:
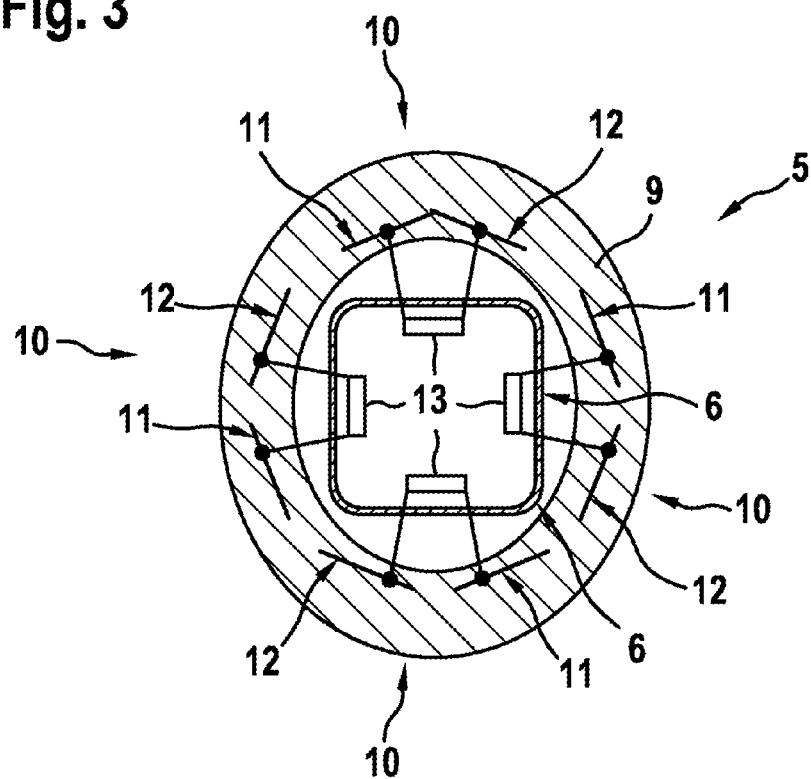

FIG. 3 shows a further application of the charging cable 5 according to the exemplary embodiment of FIG. 2, in which the cable 5 is pinched radially, as can happen if the motor vehicle 2 rolls over the cable 5, for example. According to the present exemplary embodiment, pinching causes two test lines 11, 12 of a pair 10 to be pushed further towards one another such that they come into physical contact with one another. This resultant electrical short circuit is likewise identified by the control device 8 and a corresponding cable fault is reported and possibly displayed. The load on the charging cable 5 during operation can therefore be monitored and a charging procedure can be duly interrupted, for example, or, if pinching has taken place and been detected a preferably predeterminable number of times, a recommendation to replace the charging cable 5 can be output.

Figure 4:
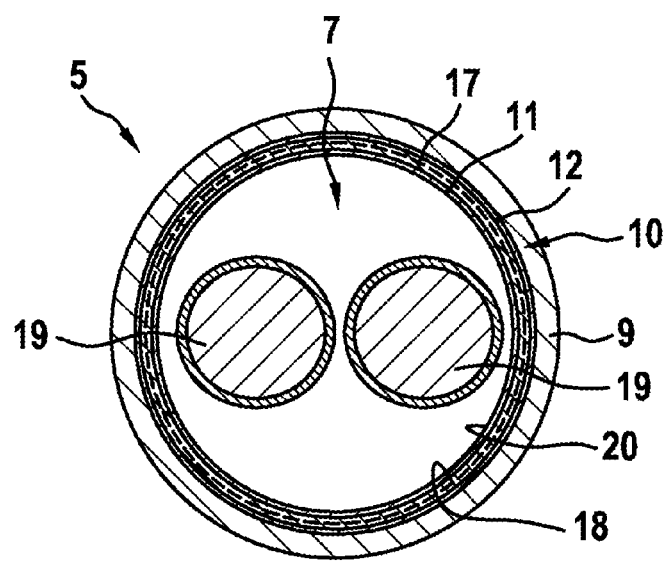

FIG. 4 shows a further exemplary embodiment of the charging cable 5, which differs from the previous exemplary embodiment in that only one pair 10 of test lines is present, wherein the test lines 11, 12 are designed coaxially to one another and are held at a radial spacing from one another by an insulator 17. In this case, the test lines 11, 12 are either integrated in the material of the sheath 9 or lie against an inner side 18 of the sheath 9, spaced from lines 19 of the cable set 7. In this case, the inner test line 11 is associated with an additional insulation layer 20 on the inwardly facing side. The insulator 17 is preferably constructed as a pressure-dependent insulation layer, in particular in the form of a pressure-dependent resistance foil or as a perforated structure, for example a honeycomb structure or lattice structure, in which the webs of the insulator 17 hold the two sleeve-like test lines 11, 12 at a spacing from one another so long as an excessive radial pressure is not applied. However, if excessive pressure is applied, the test lines 11, 12 come into physical contact and a short circuit is detected by the control device 8.

Figure 5:
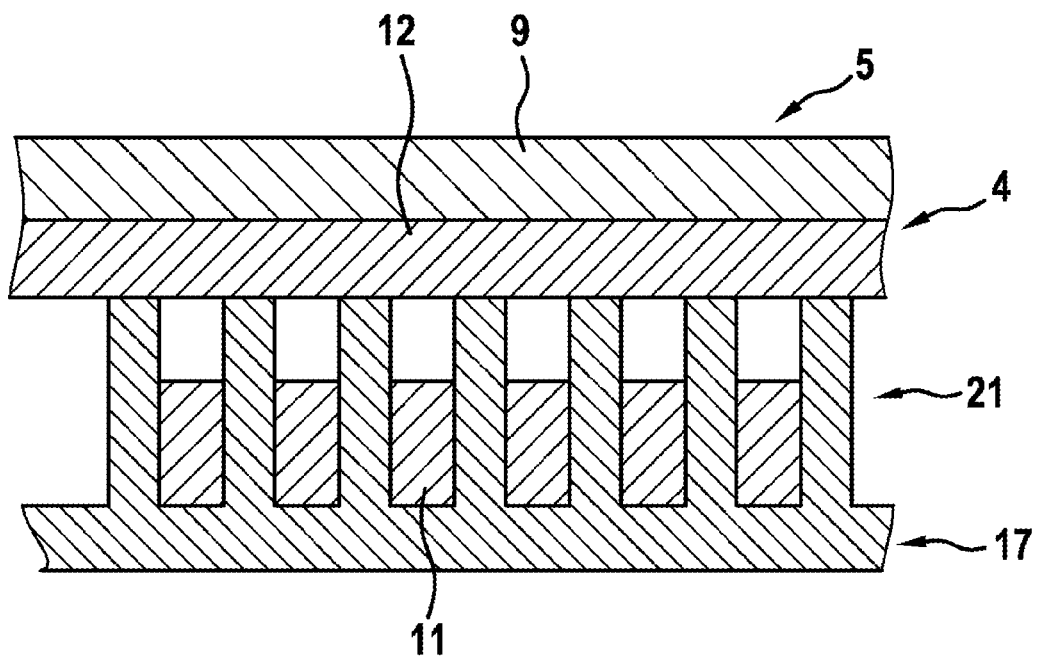

FIG. 5 shows an advantageous further development of the charging cable 5 according to the exemplary embodiment of FIG. 4, in which the insulator 17 is designed as a spacer 21 or has such a spacer. This can be realized by the said perforated or lattice structure, for example. The insulator is preferably produced from an electrically non-conductive silicone material. The inner test line 11 is advantageously designed as an electrically conductive rubber line (conductive rubber), whilst the outer test line 12 is preferably produced from copper. As a result of the spacer 21, the inner test line 11 is held at a spacing from the outer test line 12. If an excessive radial pressure is applied, the spacer 21 is preferably elastically deformed so that the test lines 11, 12 come, or can come, into physical contact with one another.

The outer test line 12 is preferably designed to be low-ohmic to be able to identify a short circuit to ground in the event that the sheath 9 is damaged. In this case, the test lines 11, 12 are preferably designed as shield lines, in particular as a supply line or strip line applied in a spiral form.

As a result of the test resistor 13, it is achieved that it is possible to differentiate between a short circuit between the test lines 11, 12 and the separation of one or more test lines 11, 12 due to tearing, shearing or the like. The active monitoring of the charging cable 5 can be produced and provided irrespective of the inner structure, i.e. the cable set 7, which comprises charging lines for DC charging or AC charging, and control/monitoring lines.

The control device 8 has, for each of the test lines 11, 12, an electrical connecting point for electrical contact therewith. By evaluating the resistance values of the test lines 11, 12 and test resistors 13 to identify the respective cable fault and optionally also monitor the charging cable 5 as to whether the test lines 11, 12 have come into contact with one of the lines 19 of the cable set 7.

One or more of the variants described above can be optionally combined with one another. According to a further exemplary embodiment, it is preferably provided that, in addition to the pairs 10 of test lines 11, 12 shown in FIG. 2, second pairs of test lines 11, 12 are present, which are arranged at a radial spacing from the first pairs to achieve an increase in the accuracy of the cable defect and to identify a defect progressively. As a result of such a multi-layered arrangement, it is, for example, possible to detect at any time when critical harm or damage to the charging cable 5 has been reached.

At least one of the test lines 11, 12 is advantageously produced from a temperature-dependent resistance material, for example as a resistance wire or foil, in order to monitor the temperature development in the charging cable 5 so that, if necessary, a charging procedure can be automatically interrupted to prevent overheating of the charging cable 5.

As a result of the advantageous design of the line set 3, it is achieved that any manipulation of, or damage to, the charging cable 5, for example also due to a leak in the case of a water-cooled charging cable 5, can be detected promptly and prompt counter-measures or safety measures can be initiated by the control device 8.

In particular, the charging cable 5 is actively monitored with the aid of the test lines 11, 12 or the pair 10 or pairs 10 of test lines, preferably even when the charging cable 5 is not in use or there is no vehicle connected to the charging cable 5. To increase the protection against manipulation, a coded signal is preferably transmitted via the test lines 11, 12 so that an unauthorized charging procedure can be easily identified and prevented, for example. In this case, the use of the advantageous line set 3 is not restricted to stationary charging stations, as described in the present exemplary embodiment. Instead, according to a further exemplary embodiment, it is provided that the line set is associated with an electrically operable motor vehicle, in particular an electric vehicle, as a replacement for the conventional charging cable or an addition thereto. Moreover, the use of the line set is possible in any situation where users work with high-voltage applications in which, in particular, high-voltage cables are used which have to conform to the charging cables of electric vehicles or satisfy similar requirements.

What is claimed is:

1. A line set (4) for a charging station (1) for charging electrical energy stores of motor vehicles (2), the line set (4) having a charging cable (5) which, at a free end, has a connecting plug (6) for electrical connection to a motor vehicle (2), wherein the charging cable (5) has one or more electrical lines (19) which are encompassed by an electrically insulating sheath (9), wherein the sheath (9) has at least one electrical test line (11, 12) which extends along the charging cable (5) and is electrically insulated with respect to the one or more electrical lines (19), wherein the at least one test line (11, 12) is configured as a ribbon line, the ribbon line having a rectangular cross section shape.

2. The line set as claimed in claim 1, wherein the sheath (9) has a pair (10) or multiple pairs (10) of test lines (11, 12) which are coupled to one another by a respective electrical test resistor (13).

3. The line set as claimed in claim 2, wherein the test lines (11, 12) of at least one pair (10) are arranged adjacent to one another as seen in a circumferential direction.

4. The line set as claimed in claim 2, wherein the test lines (11, 12) of at least one pair (10) are arranged radially above one another.

5. The line set as claimed in claim 1, wherein a test resistor (13) is arranged in the connecting plug (6).

6. The line set as claimed in claim 2, wherein multiple pairs (10) of test lines (11, 12) are arranged uniformly distributed over a circumference of the sheath (9).

7. The line set as claimed in claim 1, wherein the ribbon line is aligned tangentially in the charging cable (5).

8. The line set as claimed in claim 1, wherein the sheath (9) is cast or molded around the at least one test line (11, 12).

9. The line set as claimed in claim 1, wherein at least one of the test lines (11, 12) is produced from a temperature-dependent resistance material.

10. A charging station (1) for charging electrical energy stores of motor vehicles (2), the charging station having at least one line set (4) as claimed in claim 1 and having a control device (8), which is electrically connected to at least one of the test lines (11, 12) to identify a cable fault.

11. The charging station as claimed in claim 10, wherein the charging station (1) has means (15) for displaying a detected cable fault.

12. The charging station as claimed in claim 11, wherein the means (15) for displaying a detected cable fault includes a screen or a speaker.

13. The charging station as claimed in claim 11, wherein the means (15) for displaying a detected cable fault includes a communication device that forwards a report of a cable fault to an operator of the charging station (1).

14. A line set (4) for a charging station (1) for charging electrical energy stores of motor vehicles (2), the line set (4) having a charging cable (5) which, at a free end, has a connecting plug (6) for electrical connection to a motor vehicle (2), wherein the charging cable (5) has one or more electrical lines (19) which are encompassed by an electrically insulating sheath (9), wherein the sheath (9) has two mutually coaxially arranged test lines (11, 12), which extend along the charging cable (5), are electrically insulated with respect to the one or more electrical lines (19), and between which an electrical insulator (17) acts.

15. The line set as claimed in claim 14, wherein the insulator (17) acts as a radial spacer (21) between the test lines (11, 12) and is deformable such that the test lines (11, 12) can come into physical contact with one another as a result of a pinching of the charging cable (5).

16. The line set as claimed in claim 14, wherein the insulator (17) is a pressure-dependent resistance foil or a perforated structure.

17. A charging station (1) for charging electrical energy stores of motor vehicles (2), the charging station having at least one line set (4) as claimed in claim 10 and having a control device (8), which is electrically connected to at least one of the test lines (11, 12) to identify a cable fault.

18. The charging station as claimed in claim 17, wherein the charging station (1) has means (15) for displaying a detected cable fault.

19. The charging station as claimed in claim 18, wherein the means (15) for displaying a detected cable fault includes a screen or a speaker.

20. The charging station as claimed in claim 18, wherein the means (15) for displaying a detected cable fault includes a communication device that forwards a report of a cable fault to an operator of the charging station (1).

* * * * *